(12) United States Patent
Mahalingam et al.

(10) Patent No.: US 11,997,505 B2
(45) Date of Patent: May 28, 2024

(54) METHOD AND APPARATUS FOR CBRS NETWORK PLANNING AND OPERATING IN AN ENTERPRISE NETWORK

(71) Applicant: Celona, Inc., Cupertino, CA (US)

(72) Inventors: Nagi Mahalingam, San Diego, CA (US); Mohit Goyal, Sunnyvale, CA (US); Mehmet Yavuz, Palo Alto, CA (US); Rajeshwar Ponna, San Jose, CA (US); Rajeev Shah, Los Gatos, CA (US); Sourav Bandyopadhyay, Liluah Howrah (IN); Aparna Jaiswal, Sunnyvale, CA (US)

(73) Assignee: Celona, Inc., Campbell, CA (US)

( * ) Notice: Subject to any disclaimer, the term of this patent is extended or adjusted under 35 U.S.C. 154(b) by 939 days.

(21) Appl. No.: 17/010,584

(22) Filed: Sep. 2, 2020

(65) Prior Publication Data
US 2022/0070682 A1    Mar. 3, 2022

(51) Int. Cl.
*H04W 16/18*    (2009.01)
*G06F 30/27*    (2020.01)
(Continued)

(52) U.S. Cl.
CPC ............ *H04W 16/18* (2013.01); *G06F 30/27* (2020.01); *G06N 20/00* (2019.01);
(Continued)

(58) Field of Classification Search
CPC ... H04W 16/18; H04B 17/3913; G06N 20/00; G06N 5/04; G06F 30/27; G06F 11/3692; H04L 41/16
See application file for complete search history.

(56) References Cited

U.S. PATENT DOCUMENTS

2006/0276195 A1    12/2006 Nordling
2017/0295578 A1*   10/2017 Khoshnevisan ...... H04L 5/0032
(Continued)

FOREIGN PATENT DOCUMENTS

WO    2016014740    1/2016
WO    2019186367    10/2019

OTHER PUBLICATIONS

Thomas, Shane, International Search Report and Written Opinion received from the USRO dated Feb. 1, 2022 for appln. No. PCT/US2021/048233, 23 pgs.
(Continued)

*Primary Examiner* — Moustapha Diaby
(74) *Attorney, Agent, or Firm* — JAQUEZ LAND GREENHAUS & McFARLAND LLP; Bruce W. Greenhaus, Esq.

(57) ABSTRACT

A method and apparatus for planning a wireless communication network operating in a spectrum-controlled radio band and determining spectrum availability at an enterprise location. A plurality of network models are generated using machine learning techniques, the network models are provided to a network planner unit, input is received regarding intended deployment, and spectrum availability is determined responsive to the enterprise location. The number of BS/APs needed is estimated, and an enterprise network may be planned and deployed. The enterprise network is monitored, and if network operation is not meeting expected performance, the models may be retrained and the network planner updated. Spectrum availability is determined by registering a discovery group with an SAS at a location to provide spectrum availability, and repeating for each location. The method may be periodically performed to generate a time series of data which may be analyzed to provide spectrum availability.

16 Claims, 10 Drawing Sheets

(51) Int. Cl.
    *G06N 20/00*     (2019.01)
    *H04B 17/391*     (2015.01)
    *H04W 16/02*     (2009.01)
    *H04W 16/24*     (2009.01)
    *H04W 24/00*     (2009.01)
    *H04W 24/02*     (2009.01)
    *G06F 11/36*     (2006.01)
    *G06N 5/04*     (2023.01)
    *H04L 41/16*     (2022.01)

(52) U.S. Cl.
    CPC ...... *H04B 17/3913* (2015.01); *G06F 11/3692* (2013.01); *G06N 5/04* (2013.01); *H04L 41/16* (2013.01)

(56) References Cited

U.S. PATENT DOCUMENTS

| | | | | |
|---|---|---|---|---|
| 2018/0242178 A1* | 8/2018 | Barton | ............... | H04W 24/08 |
| 2019/0319868 A1 | 10/2019 | Svennebring et al. | | |
| 2020/0022006 A1* | 1/2020 | Froehlich | ............... | H04W 24/08 |
| 2020/0137585 A1* | 4/2020 | Agarwal | ............... | H04W 16/18 |
| 2020/0221324 A1* | 7/2020 | Carbajal | ............... | H04W 24/08 |

OTHER PUBLICATIONS

3GPP, "3rd Generation Partnership Project; Technical Specification Group Radio Access Network; NR; NR and NG-RAN Overall Description Stage 2" Release 16, 3GPP TS 38.300, v16.20, Jul. 2020, 148 pgs.

3GPP, "3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2" Release 16, 3GPP TS 36.300, v16.2.0, Jul. 2020, 390 pgs.

Alleven, Monica, "Google, CommScope, Federated and Sony get SAS Certified for CBRS", Jan. 28, 2020, 5 pgs.

Wireless Innovation Forum, "Signaling Protocols and Procedures for Citizens Broadband Radio Service (CBRS): Spectrum Access System (SAS)—Citizens Broadband Radio Service Device (CBSB) Interface Technical Specification", CBRS WInnForum Standards, Document WINNF-TS-0016, Version V1.2.5, May 18, 2020, 60 pgs.

Wireless Innovation Forum, "Requirements for Commercial Operation in the U.S. 3550-3700 MHz Citizens Broadband Radio Service Bank" CBRS WInnForum Standards, Document WINNF-TS-0112, Version V1.9.1, Mar. 11, 2020, 81 pgs.

* cited by examiner

400

```
FOR (Num Realizations R: 1 to RMax): step r
  FOR (Enb Power M: Mmin to Mmax) : step m
    FOR (TDD Config T: 0:6) : step t
      FOR (Building Type B: Bmin to Bmax) : step b
        FOR (Demand D: DMin to DMax) : step d
          FOR (System Bandwidth S: SMin to SMax) : step s
            FOR (Coverage Area A: AMin to AMax) : step a
              ☐ Randomly select shape: {Square, Rectangle, Ellipse} matching A
              FOR (Enb Count E: EMin to EMax) : step e
                ☐ Uniformly Randomly place the eNBs within Coverage Area = A
                ☐ Optimally set channels on eNBs such that co-channel neighbor
                  is minimized or avoided as much as possible.
                FOR (User Count U: UMin to UMax) : step u
                  ☐ Uniformly randomly drop mobiles within Coverage Area = A
                  ☐ Determine Pathloss to serving eNB and Signal from serving eNB
                  ☐ Determine Interference from each non-serving co-channel eNB
                  ☐ Determine SINR achievable on UL and DL
                  ☐ Determine throughput achievable with determined SINR
                  ☐ Determine success criteria met for > 95% of U
                End FOR (User Count)
              End FOR (Enb Count)
            End FOR (Coverage Area)
          End FOR (System Bandwidth)
        End FOR (Demand)
      End FOR (Building Type)
    End FOR (TDD Config)
  End FOR (Enb Power)
End FOR (Num Realizations)
```

FIG. 4

METHOD AND APPARATUS FOR CBRS NETWORK PLANNING AND OPERATING IN AN ENTERPRISE NETWORK

BACKGROUND

Technical Field

The disclosed method and apparatus relate to wireless communication networks that include a plurality of Base Station/Access Points (BS/APs) operating wirelessly in a spectrum-controlled network such as Citizen's Broadband Radio Service (CBRS) at an enterprise location.

Background

The wireless industry has experienced tremendous growth in recent years. Wireless technology is rapidly improving, and faster and more numerous broadband communication networks have been installed around the globe. These networks have now become key components of a worldwide communication system that connects people and businesses at speeds and on a scale unimaginable just a couple of decades ago. The rapid growth of wireless communication is a result of increasing demand for more bandwidth and services. This rapid growth is in many ways supported by standards. For example, 4G LTE has been widely deployed over the past years, and the next generation system, 5G NR (New Radio) is now being deployed. In these wireless systems, multiple mobile devices are served voice services, data services, and many other services over wireless connections so they may remain mobile while still connected.

Wireless networks have a wide range of applications and uses. Enterprises particularly have a great interest in implementing wireless networks at their enterprise location, and digital solutions more generally, to improve efficiency and reduce costs. Enterprises benefit from optimizing their computing, storage and networking infrastructure, and improving performance of the business applications within their business location. For this purpose, wireless network systems that make effective use of the spectrum within a business enterprise for wireless communication, improve the efficiency of communication within the organization and between the organization and the external entities. This improved communication capability at the enterprise location increases business efficiency and reduces cost.

FIG. 1 is an illustration of a basic configuration for a communication network 100, such as a "4G LTE" (fourth generation Long-Term Evolution) or "5G NW" (fifth generation New Radio) network. Through this network configuration, user equipment (UE) 101 can connect to External Packet Data Networks (PDNs) 103 and access any of a variety of services such as the Internet, Application Servers, Data Services, Voice Services, and others.

UEs

As used herein, the term "UE", or "devices", or "UE devices" refers to a wide range of user devices having wireless connectivity, such as a cellular mobile phone, an Internet of Things (IOT) device, virtual reality goggles, robotic devices, autonomous driving machines, smart barcode scanners, and communications equipment including for example cell phones, desktop computers, laptop computers, tablets and other types of personal communications devices. In some cases, the UEs may be mobile; in other cases, they may be installed at a fixed location. For example, a factory sensor may be installed at a fixed location from which it can remotely monitor an assembly line or a robotic arm's movement. In the illustration of FIG. 1, the UEs 101 include a first mobile phone 101a, a second mobile phone 101b, a laptop computer 101c, and a printer 101d.

The UEs 101 connect wirelessly over communication links 105 to a Radio Access Network (RAN) 107 that includes a base station/access point (BS/AP) 109. One of the advantages of such networks is their ability to provide communications to and from multiple wireless devices and provide these wireless devices with access to a large number of other devices and services even though the devices may be mobile and moving from location to location.

BS/APs

The term 'BS/AP' is used broadly herein to include base stations and access points, including at least an evolved NodeB (eNB) of an LTE network or gNodeB of a 5G network, a cellular base station (BS), a Citizens Broadband Radio Service Device (CBSD) (which may be an LTE or 5G device), a Wi-Fi access node, a Local Area Network (LAN) access point, a Wide Area Network (WAN) access point, and should also be understood to include other network receiving hubs that provide access to a network of a plurality of wireless transceivers within range of the BS/AP. Typically, the BS/APs are used as transceiver hubs, whereas the UEs are used for point-to-point communication and are not used as hubs. Therefore, the BS/APs transmit at a relatively higher power than the UEs.

Core Network

The RAN 107 connects the UEs 101 with the Core Network 111. One function of the Core Network 111 is to provide control of wireless signaling between the UEs 101 and the RAN 107, and another function is to provide access to other devices and services either within its network, or on other networks such as the External PDNs 103. Particularly, in cellular networks and in private networks, the BS/AP 109 can receive wireless signals from, and send wireless signals to, the UEs 101. The RAN 107 is coupled to the core network 111; therefore, the RAN 107 and the Core Network 111 provide a system that allows information to flow between a UE in the cellular or private network and other networks, such as the Public Switched Telephone Network (PSTN) or the Internet. Wireless data transmission between a UE 101 and the BS/AP 109 occurs on an assigned channel, such as a specific frequency. Data transmission between the BS/AP 109 and the Core Network 111 utilizes any appropriate communication means, such as wireless, cable, and fiber optic.

In addition to providing access to remote networks and allowing information to flow between the cellular network and the external PDNs 103, the Core Network 111 provides control of the air interface between the BS/AP 119 and the UEs 101. The Core Network 111 may also coordinate the BS/APs 109 to minimize interference within the network.

CBRS Networks

One type of wireless network that recently became available for general use by enterprise locations is a Citizen's Broadband Radio Service (CBRS) network, which utilizes the CBRS radio band of 3550-3700 MHz, nominally divided into fifteen channels of 10 MHz each. Particularly, the US Federal Government recently approved use of the CBRS band of the frequency spectrum and finalized rules (Rule 96) that allow general access to the CBRS band. The CBRS rules set forth detailed requirements for the devices that operate in a CBRS network and how they communicate. CBRS supports both LTE and 5G devices.

In order to accommodate prior users in this spectrum and as a condition for opening it for general use, certain prior users (including the military) have been given a higher priority to access the spectrum. To ensure that these users are given higher priority, use of this radio band is subject to spectrum control by a Spectrum Access System (SAS). Any enterprise implementing a CBRS network must follow the directions given by the SAS, such as which channels it can use and how much power it can transmit. In some instances, previously authorized channels may be suspended (temporary suspension of grant) or fully terminated (permanent termination of grant) by the SAS, and the CBRS network is then given a fixed period of time (sixty seconds currently) to terminate transmissions on that channel, which unfortunately can disrupt enterprise network operations and require reconfiguration to compensate for the lost channel.

Reference is now made to FIG. 2, which is a diagram of a wireless communication network in which a CBRS system can be implemented. A plurality of BS/APs 201, 202, 205, 206 are deployed in an enterprise location 200. In FIG. 2, each BS/AP has a range, which represents its wireless coverage. The BS/APs may be CBSDs in a CBRS system. A first UE 202 is wirelessly connected to a first BS/AP 201, which is providing service to it. A second UE 204 is wirelessly connected to a second BS/AP 202, and is providing service to that second UE 204. Other UEs, which connect to the BS/APs, are shown in the enterprise location 200. All the BS/APs are connected to a PDN 220 by any appropriate communication means, such as wire, fiber optic, and wireless radio. The PDN 220 provides a connection to an operator network 222 that includes an OAM Server 207, a SON assist unit 208, a Domain Proxy 209, an Automatic Configuration Server (ACS) 210 and a Location Database 211, all of which are connected to each other within the operator network 222 by any appropriate means. The operator network is connected to an SAS 212, which is connected to a Spectrum Database 213 that includes data regarding the spectrum that it is managing. Collectively, the SAS 212 and the Spectrum Database 213 are referred to as a Spectrum Management Entity (SME) 214.

Base stations (BS/APs) within a CBRS network are termed "CBSDs", and UEs are termed End User Devices (EUDs). CBSDs are fixed Stations, or networks of such stations, that operate on a Priority Access or General Authorized Access basis in the Citizens Broadband Radio Service consistent with Title 47 CFR Part 96 of the United States Code of Federal Regulations (CFR).

The CBRS rules require that a Spectrum Access System (SAS) allocate spectrum to the CBSDs to avoid interference within the CBRS band. The Spectrum Access System (SAS) is a service, typically cloud-based, that manages the spectrum used in wireless communications of devices transmitting in the CBRS band, in order to prevent harmful interference to higher priority users such as the military and priority licensees. A CBRS device (CBSD) needs authorization from the SAS before starting to transmit in the CBRS band. Even after authorization, the SAS may suspend or terminate authorization of one or more the channels previously authorized.

Regardless of complexities, the CBRS band provides an opportunity to create new wireless networks, and there is a desire for utilizing and making maximum use of spectrum in the CBRS band while following the rules pertaining the CBRS usage, including effectively responding to directions from the SAS.

Network Planning Considerations

One of the considerations when planning a wireless network is the number and placement of the radio nodes (BS/APs) needed to effectively cover a geographic area at wireless networking location. The number of radio nodes is dependent on many factors such as (a) the number of users projected to be serviced, (b) the availability of spectrum (and the frequency reuse factor), and (c) the throughput requirement per user. All of these and other factors may have an influence on the number of radio nodes required and the quality of service extractable from those radio nodes collectively.

Particularly in a dense deployment, the amount of interference measurable on that channel increases as the number of radio nodes operating on the same channel increases. The amount of increase in interference on a channel is not strictly proportional to amount of increase of radio nodes reusing that channel since the intensity of interference depends on the loading of each radio node, and therefore planning becomes more complicated.

In macro-operator networks (such as AT&T), the network is planned well in advance before deployment. The RF terrain, number of users that need to be supported, the areas where the coverage and capacity are necessary are some of the parameters may be input into a modeling tool to plan an appropriate azimuth, antenna gain, 3 dB beamwidth, conductive transmit power, and other qualities needed by the radio nodes. In networks where multiple 4G LTE eNBs and 5G NR gNBs are required to be deployed and coexist, additional planning is required. At indoor locations, building and floor plans, materials used in the building, obstructive materials such as walls, windowpanes and others are required as inputs in addition to the coverage/capacity targets. RF modeling tools such as iBWave can be employed for this purpose by importing a building plan into the tool and performing ray tracing or by applying appropriate pathloss models to determine coverage and capacity requirements.

In Private 4G LTE and Private 5G NR solutions, typically targeted towards enterprise deployments, such modeling campaigns are not always possible, not embraced and often expensive. Enterprise connectivity historically has been provided by Wi-Fi radio access technology. Recently, there has been keen interest in replacing and/or supplementing Wi-Fi services in enterprise with 3GPP-based radio technologies such as 4G LTE and 5G NR. One of the main reasons why Wi-Fi adoption in enterprise has been significant is the ease of initial network planning. The indoor Wi-Fi units are typically low powered units (e.g., 20 dBm) and determining the number of such Wi-Fi units for a given coverage area (e.g., 250,000 sq. ft) can be roughly estimated with no necessity for expensive modeling or lengthy planning. Once the units are deployed, some adjustments can still be made (e.g., addition of 1 or 2 Wi-Fi units in specific places) without upsetting or invalidating existing plans.

To ensure LTE and NR can be adopted for enterprise deployments as easily as Wi-Fi has been in the past depends on how easily and simplistically the initial network planning can be performed for Private LTE and Private NR systems. It is even more complex in CBRS networks since the availability of spectrum is geography dependent and it is notoriously difficult to preplan the network without determining the availability of spectrum a priori. Also, as mentioned above, the SAS may suspend or terminate authorization of one or more the channels previously authorized. This disclosure provides a system for optimal determination of number of access points necessary to cover a geography given certain inputs.

SUMMARY

Various embodiments of method for planning a wireless communication network operating in a spectrum-controlled radio band and determining spectrum availability at an enterprise location are disclosed. In one embodiment a method of planning, deploying, and operating a spectrum-controlled wireless communication network includes the steps of generating a plurality of network models using machine learning techniques responsive to a predictor space that includes at least one of spectrum availability, topology definitions, Node/Link configurations, pathloss models, and line-of-sight probabilities, storing the network models in a models database, providing the network models to a network planner, receiving input into the network planner regarding intended deployment, including location and at least one of building type, network requirements, and number of devices. Responsive to the location input, spectrum availability at the location is determined, and responsive to the input and spectrum availability, the number of BS/APs needed to cover the deployment is estimated and deployed.

The method may further comprise performing a Discrete Event/Monte Carlo simulation responsive to the predictor space, storing successful iterations of the simulation in a Predictor Database, and generating the network models responsive to the successful iterations. An enterprise network may be planned and deployed responsive to the estimate. The enterprise network may be monitored, including collecting statistics regarding network operation, and if network operation is not meeting key performance indicators (KPIs), then the model can be retrained and the network planner can be updated with the retrained model.

In one embodiment the spectrum controlled network is a CBRS network wherein the spectrum is controlled by a Spectrum Access System (SAS), and predicting spectrum availability includes inquiring regarding spectrum availability with the SAS at each of the plurality of locations, and storing the spectrum availability for each of the plurality of locations.

A network orchestration module is disclosed for planning and administering a plurality of spectrum-controlled, wireless communication networks, each network including a plurality of Base Stations/Access Points (BS/APs) located at an enterprise location. The network orchestration module includes a model generator module including a network training module that includes machine learning and artificial intelligence for generating a plurality of network models responsive to a predictor database, a models database for storing the network models, a Spectrum Availability Repository that stores spectrum availability at a plurality of locations, and a network planner connected to the models database for storing and implementing at least one of the network models. The network planner is also connected to the Spectrum Availability Repository, receives input regarding intended deployment of an enterprise network including an enterprise network location, and thus the network planner can determine spectrum availability responsive to the enterprise network location.

The network orchestration module may include a Spectrum Inquiry Service Module for predicting spectrum availability at each of a plurality of locations and storing the predicted spectrum availability in the Spectrum Availability Repository. The Spectrum Inquiry Service Module is connected to a remote Spectrum Access Service (SAS), and includes means for inquiring with the SAS regarding spectrum availability at a plurality of locations. The inquiry with the SAS can be periodically repeated to provide a time series of spectrum availability data for each of the plurality of locations.

A method is disclosed for determining availability of controlled spectrum at a plurality of locations in which spectrum is controlled by a Spectrum Access System (SAS). The method includes providing a discovery group that comprises a plurality of Base Station/Access Points for registration with the SAS, providing a geographical list defining a plurality of locations, selecting one of the locations, registering the discovery group at the selected location with the SAS, making a spectrum inquiry request with the SAS for the registered discovery group, receiving and storing data from the SAS regarding spectrum availability at the selected location in a Spectrum Availability Repository, de-registering the discovery group with the SAS. The process is repeated for each of the plurality of locations in the geographical list, so that the spectrum availability for the plurality of locations is stored in the Spectrum Availability Repository. The method may be periodically performed a number of times to generate a time series of spectrum availability data, which is stored in the Spectrum Availability Repository for the plurality of locations.

The time series data of spectrum availability for a selected location may be analyzed with machine learning and artificial intelligence to find patterns in the time series data, and responsive to the patterns, spectrum availability can be provided for the selected location, and predictions of changes in spectrum availability can be made. The current spectrum availability and the predicted changes in spectrum availability can be provided to a Network Planner which, responsive thereto, plans an enterprise network including providing a number of BS/APs. In some embodiments the wireless network operates on the Citizen's Broadband Radio Service (CBRS band), the BS/APs comprise CBRS Devices (CBSDs) that are located at an enterprise location and form part of an enterprise network.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

FIG. 4 is a pseudocode example of the Monte Carlo simulation shown in FIG. 3B.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION (1) 4G and 5G Communication Networks and Systems

Communication networks and system components are described herein using terminology and components relating to CBRS systems and their approved (registered) interfaces including 4G (LTE) (IEEE 802.16e), 5G NR 3GPP TS 38.300, E_UTRA (3GPP TS 36.300) communication systems. For instance, the term "Citizens Broadband Radio Service Device" or "CBSD" is one implementation of a Base Station/Access Point (BS/AP), and used herein for descriptive purposes in the context of a CBRS system. The principles of the communication network described herein more widely apply to other communication networks and systems, and particularly to any spectrum-controlled communication system and network.

(2) Enterprises and Enterprise Networks

An implementation in the context of an enterprise network is described herein. Although described in the context of an enterprise network, the principles disclosed can also apply to any private network and more generally public networks. An enterprise network is one type of private network. Private networks are operated for use within a limited area by a limited group of authorized users, whereas public networks generally cover a larger area and are open for use by anyone that subscribes to the service by the network operator. An enterprise network is created at an enterprise location such as a warehouse, factory, research center or other building, and is usually operated by an organization for its own use. Other types of private networks may be operated by a private network manager for use by more than one organization.

(3) Network Location Planning: Prediction Model, Method

Figure 5:
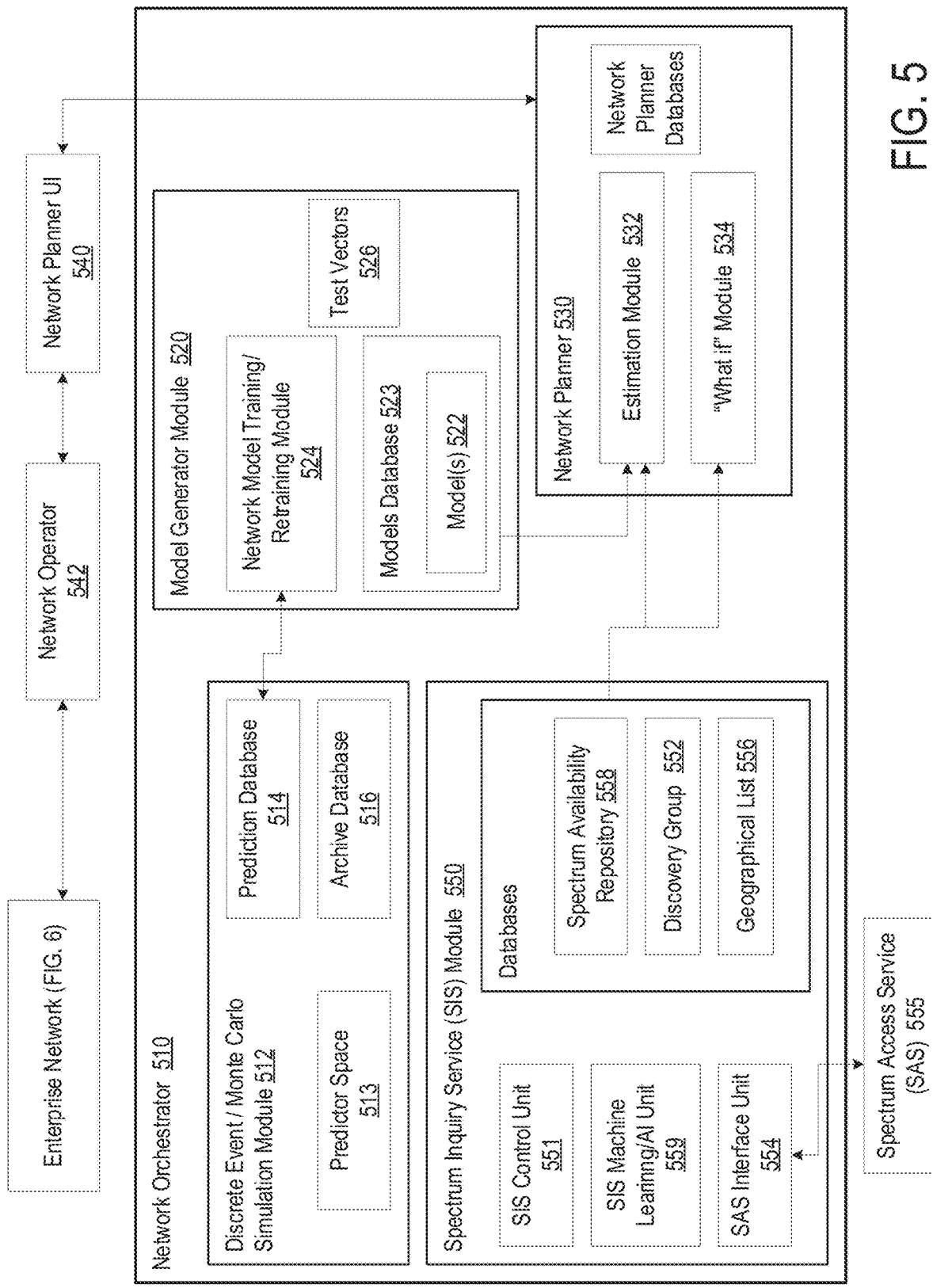
FIG. 5 is a block diagram illustrating elements in a network orchestrator that are utilized in the network planning method.

FIGS. 3A-3E and FIG. 5 are referenced in the following discussion. FIGS. 3A, 3B, 3C, 3D, and 3E are combined flow charts of operations to plan, implement, and update a deployment of a CBRS wireless communication network at an enterprise location. FIG. 5 is a block diagram that illustrates elements in a network orchestrator 510, that are utilized in the network planning method. This method and apparatus can provide system for optimal determination of the number of access points necessary to cover a geography (e.g. an enterprise location), given appropriate inputs.

After the start of operations (STEP 300), data and information from one or more networks, actual or hypothetical, are collected to be used as inputs (STEP 302). The combined inputs are referenced as the "predictor-space" 513, and can include one or more of the following parameters for a deployment: topology definitions (e.g., building type, materials used in the building, coverage requirement, number of UEs), number of users and data demand per user, node/link configuration (e.g., LTE Time Division Duplex (TDD) configuration, Special Subframe (SSF) configuration, power limits), PHY abstraction, Path Loss (PL) models, Line of Sight (LOS) probabilities, and spectrum availability. This information can be obtained from any suitable source, such as existing deployments, planned deployments, typical deployments, and frequent deployments, actual or hypothetical. Following is a table describing the variables used herein as inputs in this example.

| Variable | Description | Units (example) |
|---|---|---|
| A | Coverage Area | Square feet |
| B | Building Type | Indoor office-space, Warehouse |
| S | Spectrum Available (System Bandwidth) | MHz |
| U | Number of Users | # |
| D | Data demand $D_{UL}$: Data for uplink $D_{DL}$: Data for downlink | Mbps |
| E | Number of BS/APs | # |
| T | TDD configuration and special subframe configurations | 2 uplink slots and 6 downlink slots per 10 milliseconds |
| M | Transmit Power Mx: Maximum transmit power Mn: Minimum transmit power | Watts |

(4) Discrete Event/Monte Carlo Network Simulation

Given the input variables in the "predictor-space" (STEP 302), arranged in vectors, a discrete event/Monte Carlo simulation (STEP 304) is performed in a Discrete Event/Monte Carlo Simulation Module 510 (shown in FIG. 5). This simulation can be performed using any appropriate commercially-available Monte Carlo simulation software. Monte Carlo simulation generally includes performing a series of iterations, changing at least one variable in the predictor-space at each iteration, a very large number of times.

Figure 1:
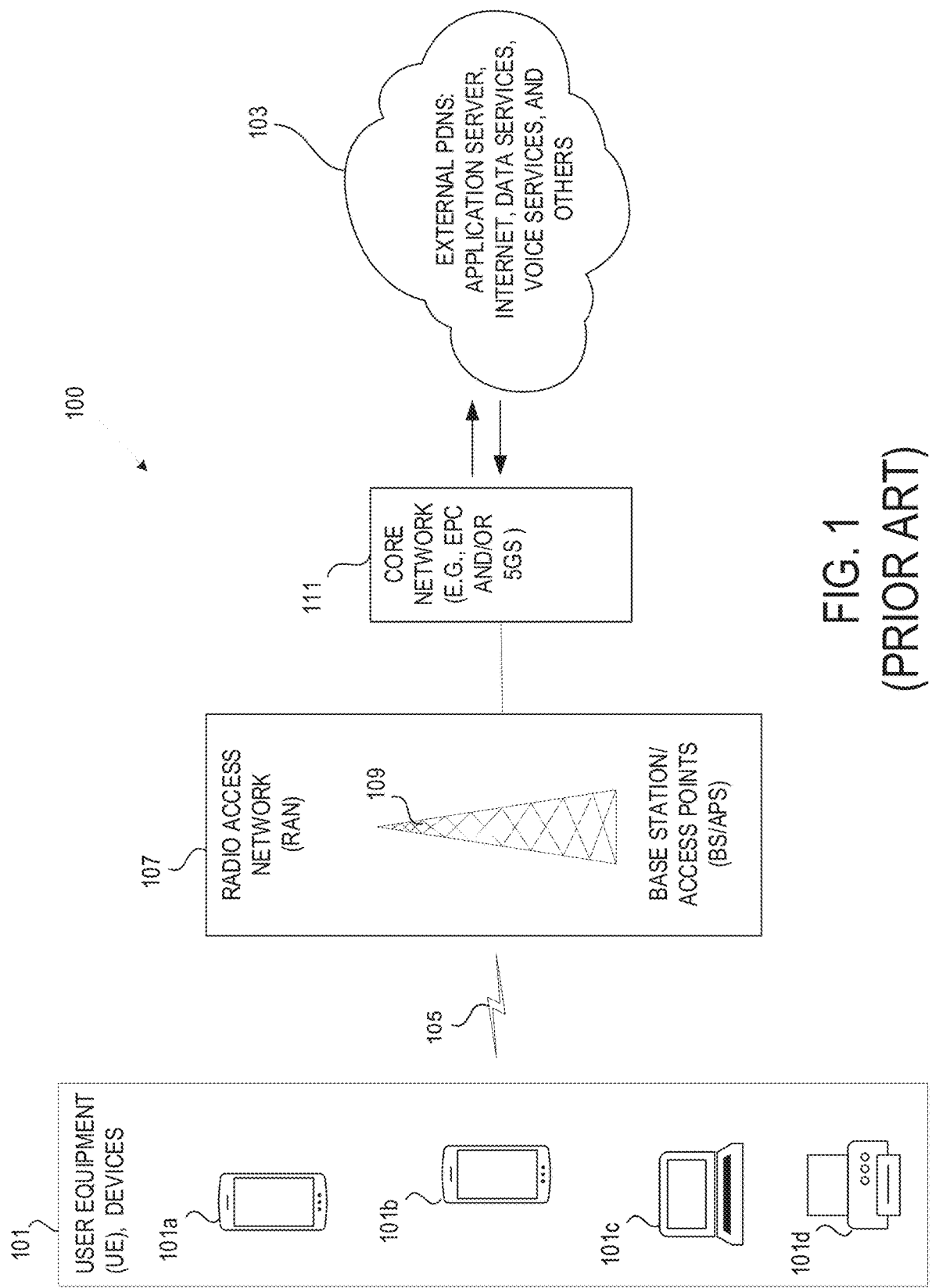
FIG. 1 is an illustration of a basic configuration for a communication network, such as a "4G LTE" (fourth generation Long-Term Evolution) or "5G NR" (fifth generation New Radio) network.
Figure 2:
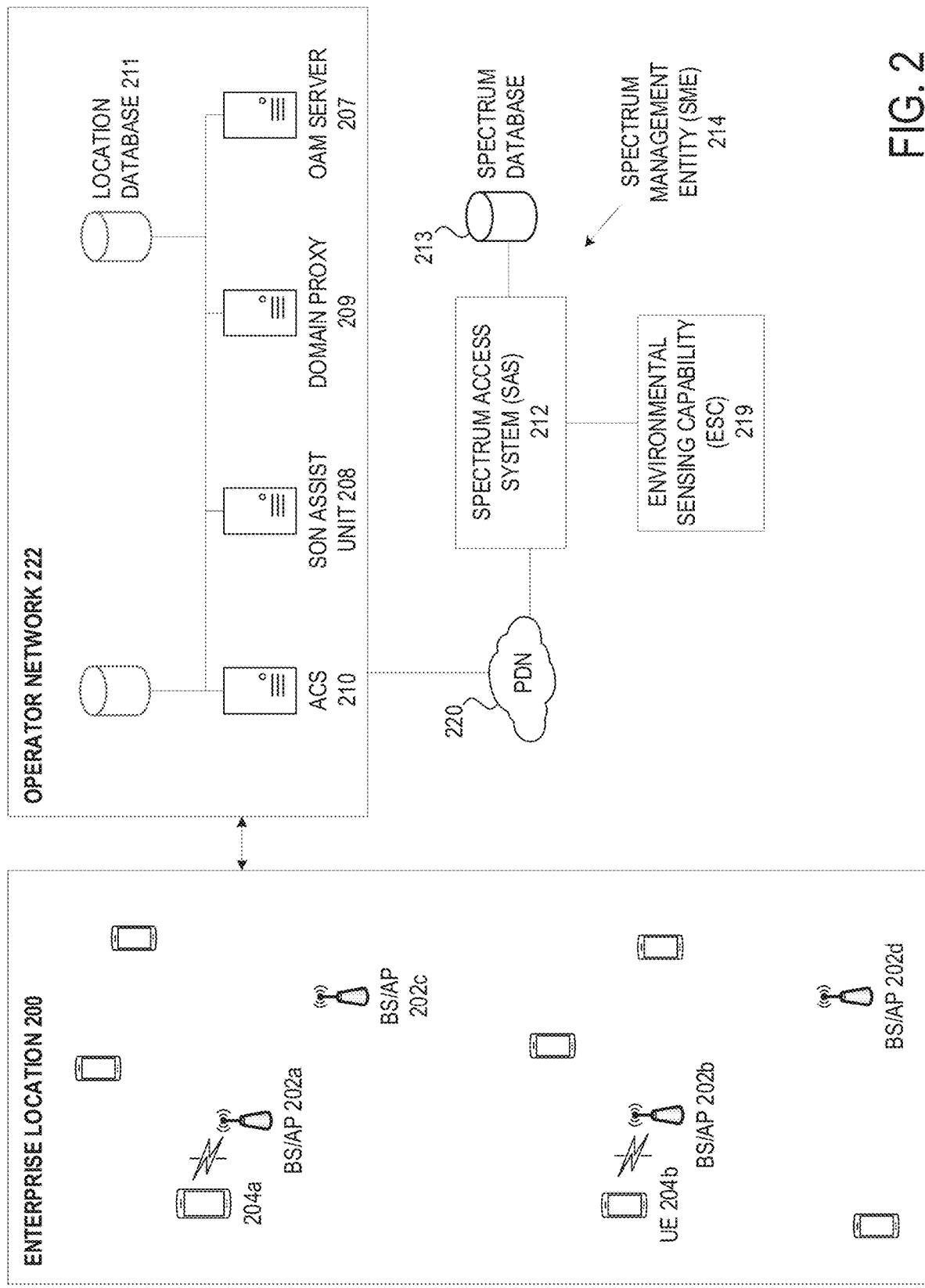
FIG. 2 is a diagram of a wireless communication network in which a CBRS system can be implemented, including BS/APs deployed at an enterprise location and UEs wirelessly connected to them.
Figure 3A:
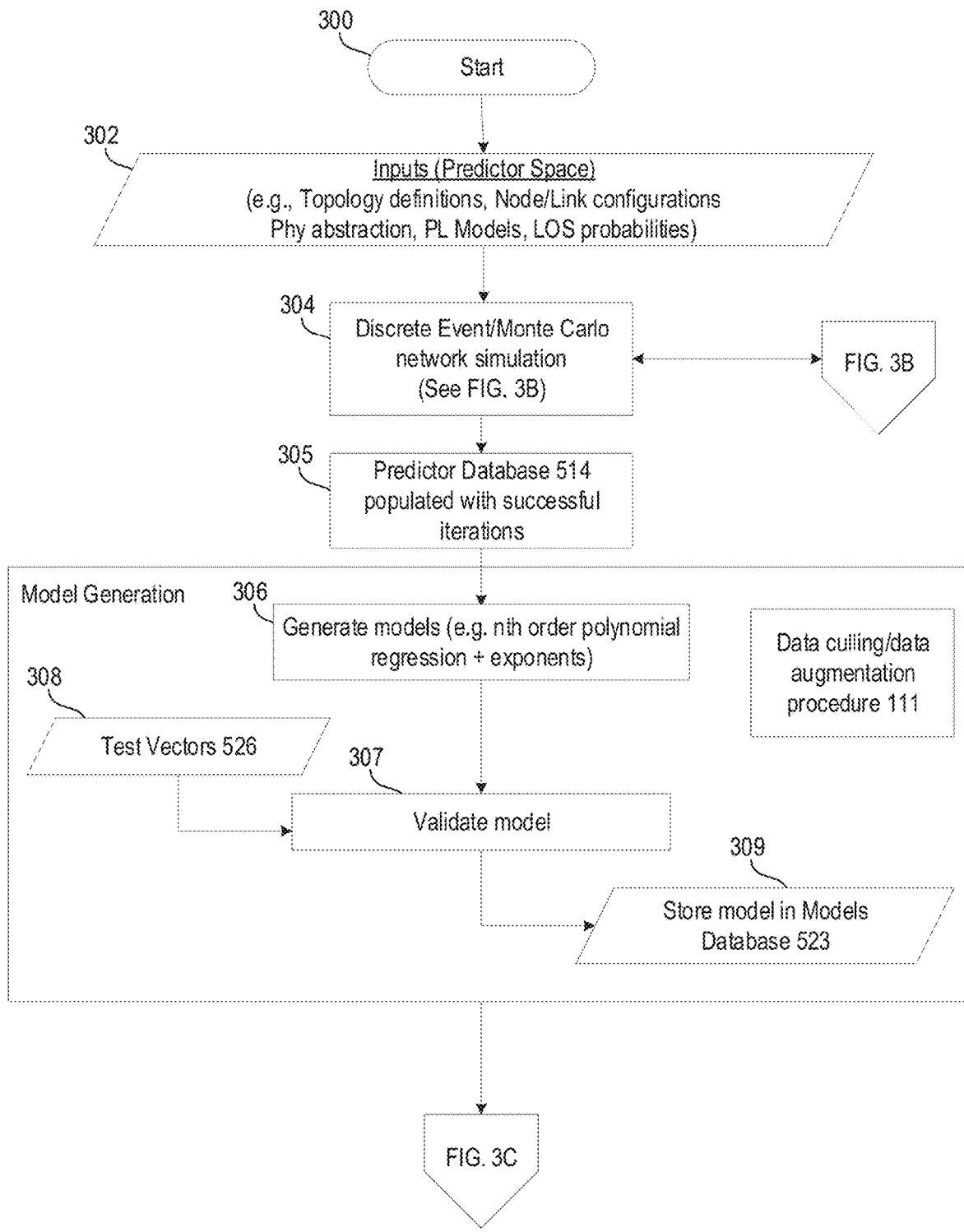
FIG. 3A is a flow chart that combines with FIGS. 3B, 3C, and 3E to show operations to plan, implement, and update a deployment of a CBRS wireless communication network at an enterprise location.
Figure 3B:
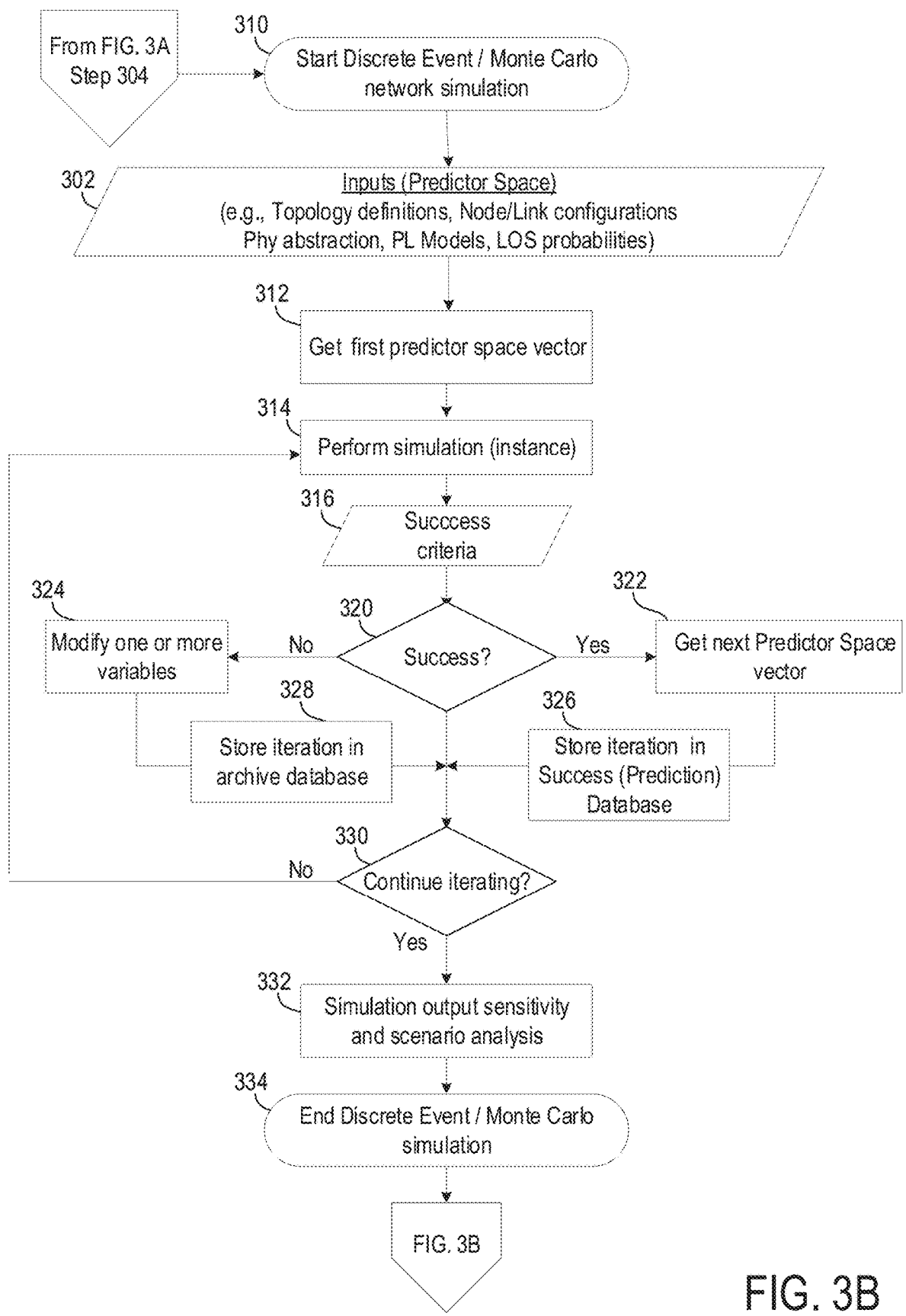
FIG. 3B is a flow chart that combines with FIGS. 3A, 3C, and 3E to show operations to plan, implement, and update a deployment of a CBRS wireless communication network at an enterprise location.
Figure 3C:
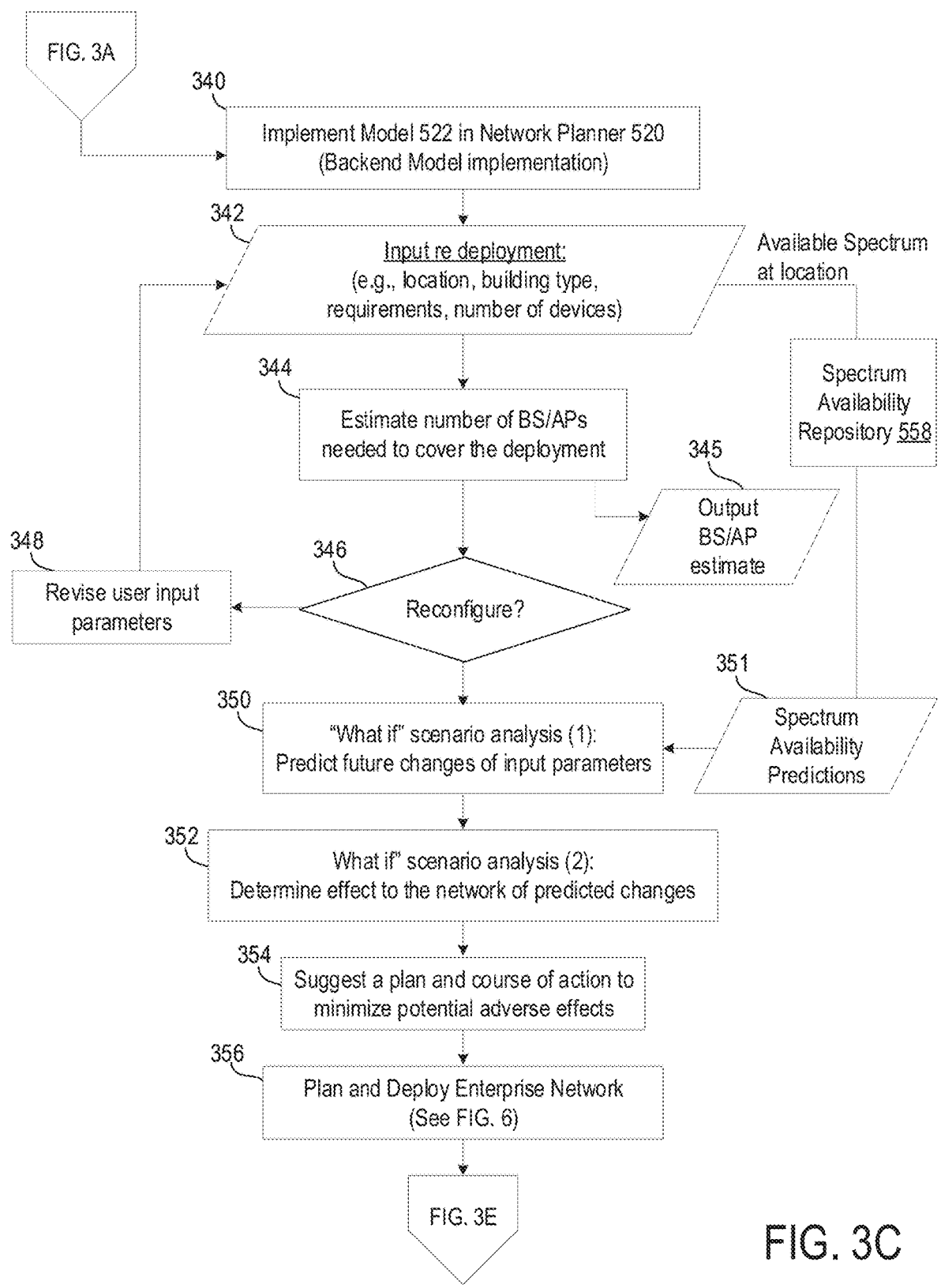
FIG. 3C is a flow chart that combines with FIGS. 3A, 3B, and 3E to show operations to plan, implement, and update a deployment of a CBRS wireless communication network at an enterprise location.

FIG. 3B is a flow chart of operations of the Discrete Event/Monte Carlo simulation shown at 304 in FIG. 3A. After operation begins (STEP 310), the predictor space 513 is in made available for operations. Following is an example: given the coverage area of A sq. ft, the building type B, user count U, and D Mbps demand per user, we perform discrete event Monte Carlo simulation with E BS/APs. Suppose the spectrum available is S MHz. In an example CBRS system, S={10, 20, . . . , 150} MHz, in 10 MHz increments. Suppose T refers to the TDD configuration and special subframe (SSF) configurations. Suppose the maximum transmit power of the BS/AP is equal to Mx, and suppose the minimum transmit power of the BS/AP is equal to Mn. Starting with one BS/AP (E=1) and M=Mx, for a particular system bandwidth S and a uniform dropping of U users, each with demand D spread over A sq. ft, an appropriate 3GPP pathloss model and associated line-of-sight (LOS) probabilities are employed to determine the cell capacity achievable.

In the predictor space 513, the same instance of the simulation can be realized several times (e.g., 500 times) with a different uniform dropping of U users in each realization. The mean of 500 realizations can then be stated to represent the achievable capacity in the system, given the predictor space {A, B, S, U, D, E, T, M}. Note that D implicitly refers to Data for downlink (DDL) and Data for uplink (DUL).

In operation, a first predictor space vector is obtained (STEP 312) and a simulation (instance) (STEP 314) is performed. Success criteria is supplied (STEP 316), and then the results of simulation for each instance are evaluated (STEP 320). As one example of success criteria, for each instance, stating that if at least 95% of area A is covered by the BS/AP configuration in the previous step, and at least 95% of the U users meet or exceed their demand D, then the configuration is deemed to be a success at STEP 320, and the next Predictor Space vector is obtained (STEP 322). However, if the success criteria are not met, then one or more of the variables {A, B, S, U, D, E, T, M} can be modified (STEP 324), and this can be repeated until success criteria are met. For example, having simulated with one BS/AP (E=1), we can then increment the BS/AP count E by 1 and repeat the Monte Carlo simulation for the identical set of input parameters mentioned above. The success criteria can again be evaluated at the end of the run. The simulator, in fact, will vary each parameter across its entire valid range as shown in the pseudo code 400 shown in FIG. 4.

Each combination of input parameters that meets the success criteria is stored (STEP 326), into a success database also termed a prediction database 514. A combination set of input variables that does not meet the success criteria are not stored in prediction database 514, and may be stored in another database (e.g. the Archive Database 516) archived for future reference (STEP 328).

This process goes through a number of iterations. At each iteration a decision (STEP 330) is made determining whether to continue iterating or exit the process. Generally, the number of iterations is determined by the number of possibilities, which is very large and will continue for a very long time.

The Monte Carlo simulation in this case might consume a great deal of time and computing resources, since the minimum and maximum values for each input parameter can be arbitrarily large (wide range). One example is variable A and it could range from 20K sq. ft to 10 M sq. ft, for instance. Due to the large range in values, the Monte Carlo simulation 104 might take multiple days (depending upon computer resources) to complete since the range of one parameter is simulated in combination with ranges of other parameters and to exhaust this combination set can be a significant effort. Even if the simulation is run for a specific customer site for specific set of input parameters {A, B, S, U, D, E, T, M}, it might still take a long time to generate the results. As will be described in more detail below, it is desirable to develop a prediction model based on offline simulations using the results stored in the prediction database 514 that can be run ahead of time. Using such a prediction model, the required result (e.g., number of BS/APs) can be generated much faster (may be almost in real time) as function of the input parameters, which is much more user-friendly than the Monte Carlo simulation.

Typically, in the simulation, a certain amount of external interference may also be modeled. The coverage A can be assumed to be in the presence of radio channels that are already in use (e.g. by other BS/APs from other operators) and thus certain interference is generated by other BS/APs already in that or near that geography. Since the amount of incoming interference is not known a priori, it is modelled as a configurable parameter may be estimated from other previous, actual deployments in the vicinity. This interference can be added to any Signal to Noise plus Interference Ratio (SINR) computation within the simulation described earlier. The output of the Monte Carlo simulation is exhaustive.

The prediction database 514 can be thought to contain N viable inputs in various combinations that would result in a successful deployment. Conversely, if (N−1) input variables are known with certainty, we can determine the remaining "1" variable from this database that would result in success. For example, if we have 300,000 sq. ft, a building made of wood and plaster, 40 MHz of spectrum available, 3 Mbps of demand per user, and 300 users, from the prediction database 514 we would be able to pick out the number of BS/APs that will be required to result in success criteria.

The input variables are called the predictor-space 513. The simulation output is non-linear, in that it is not always possible to assert that e.g. if we needed three BS/APs to serve 100 users with certain demand, then we would be needing six BS/APs to serve 200 users. The reason is, if the BS/APs are operating co-channel, then as we add more BS/APs we are compounding the interference and mean deliverable capacity is reducing per BS/AP. As an example, if two or more BS/APs are going to use the same channel (co-channel, due to limited spectrum availability), then possibly we would be needing eight BS/APs to serve 200 users since six BS/APs would not suffice. These sort of nuances are encapsulated by the Monte Carlo 104 simulation and results captured in the prediction database.

The results of the Monte Carlo simulation can be reviewed and further analyzed (STEP 332) looking for patterns. In scenario analysis, we can find which of the input variables had values together for certain outcomes, which can be useful for further analysis. In sensitivity analysis, we can find which input variables had the biggest effect on the results. Both scenario and sensitivity analysis can be useful, as well as other analyses of the results.

The Discrete Event/Monte Carlo simulation is then complete (STEP 334), and operation exits from FIG. 3B and returns to FIG. 3A in which the next step (STEP 305) indicates that the Prediction database 514 is now populated with successful iterations.

(5) Model Generation

As mentioned above, it is desirable to develop a prediction model based on the Monte Carlo simulation results stored in the Prediction database 514. After developing such a prediction model, this model can be used to determine a result (e.g. the number of BS/APs) much faster than the Monte Carlo simulation (may be almost in real time), which is much more user-friendly than the Monte Carlo simulation itself. For these purposes, a Model Generator Module 520 is provided that includes a plurality of Models 522 stored in a Models Database 523, a Network Model Training/Retraining Module 524 that includes machine learning and artificial intelligence, and a plurality of Test Vectors 526.

It has been observed that the results stored in the prediction database 514 do not necessarily exhibit linearity, as highlighted by the example above. Thus, one or more models 522 can be generated (STEP 306) by the Network Model Training/Retraining Module 524, using the successful results stored in the prediction database 514 and appropriate mathematical, and/or machine learning techniques, to describe the relationship between the predictor-space variables stored in the prediction database 514. In other words, the results in the prediction database 514 can be "fit" into one or more models 522 that represent a relation between the various input variables and an output variable. The models 522 can have a variety of forms, for example the relationship may be mathematical: a linear regression model may be appropriate for a dataset that exhibits a high degree of linearity whereas an Nth degree polynomial regression model 522 may be applicable to other data sets. In some cases, it can be useful to cluster the data set in the prediction database 514, and sophisticated clustering models 522 can be developed to describe such data. The model can also be table-based.

A model 522 may be an estimator or a probabilistic predictor, and there is potential for some error in the estimate compared with the mean. A good model is one that minimizes the mean-square error (MSE) and one whose MSE is below a dimensioned threshold. Note that the model 522 need not be a singular model, but several concurrent models can be developed to describe the dataset in full or relevant portions by means of segmenting, clustering, or other techniques.

Since the objective of the models 522 is to help with network planning, usually it is very helpful to add a conservative margin to the prediction database 514. For example if 11 BS/APs are initially deemed to be required, operating over 40 MHz, to serve 300 users each with a constant demand of 3 Mbps, the prediction database can add a margin and mark that 12 BS/APs are deemed to be required instead of 11. Alternatively, if the coverage area cannot accommodate more than 11 BS/APs on a 40 MHz bandwidth, the prediction database can add a margin and mark that no more than 285 users can be served a constant demand of 3 Mbps.

A model's efficiency can be tested (validated) (STEP 307) by inputting (STEP 308) a list of robust test vectors 526 to validate (or not validate) the model. The test vectors 526 can be synthetic test vectors, i.e., a fraction of the success and non-success output from the Monte Carlo simulation 304, and/or test vectors from another real-world deployment.

Polynomial models and certain other types of models can cause "over-fitting" in some scenarios. Hence, at this stage, it can be useful to add exponential terms to at least some of the models 522 to avoid overfitting data, and correct for potential increases in MSE.

After a model(s) 522 has been sufficiently validated to exhibit high confidence intervals for a broad range of test vectors 526, and from differing sources (e.g. different locations, different networks), the model is stored (STEP 309) in the Models Database 523 and is ready for use.

(6) Network Planner and UI

Once a model 522 has been sufficiently validated (STEP 309, FIG. 3A), the model is implemented (STEP 340, FIG. 3C) in a Network Planner 530, which functions as a backend model implementation. The Network Planner 530 is connected to a Planner User Interface (UI) 540, which functions as a front-end user interface which may in some embodiments be part of the network orchestrator 510. The Planner UI 540 is configured to receive user input from a network operator 542 and communicate with the Network Planner 530. The Network Planner 530 estimates the needed number of BS/APs, possibly providing an upper and a lower limit, using the implemented model responsive to user input received from the Planner UI 540. Note that the Network Planner 530 may implement multiple models, which allows selection of one or more models appropriate to a particular situation. For example, multiple mathematical model formulations may be implemented in the Network Planner 530, which can select an appropriate model for the particular inputs.

The network operator 542, after gaining access to the Planner UI 540, inputs data and information (STEP 342) relevant to the enterprise deployment, which may be a planned or a current deployment. The user input into the Planner UI 540 by the network operator 542 may include one or more of the following: location (e.g. address/GPS), building type (e.g., oil and gas field), requirements (e.g. coverage, CBR (Constant Bitrate which refers to a guaranteed quality of service), VBR (Variable Bit Rate), activity factors), the number of devices expected (e.g. type, ratio, maximum), and anything else that may be useful in planning a network. Spectrum availability for the geographical location can be provided by the Spectrum Inquiry Service (SIS) Module 550.

In response to these inputs, the Network Planner 530 can estimate (STEP 344) in an Estimation Module 532 the number of radio nodes (BS/APs) that would be required to cover their enterprise, possibly giving a range and providing other information that might be useful for a deployment and providing an output 345 that may be given to the network operator 542.

After estimating the number of BS/APs (STEP 344) the network operator 542 may wish to consider alternative configurations and reconfigure the deployment (STEP 346). In such a case, the network operator 542 can revise the previous inputs (STEP 348) and again estimate the number of BS/APs (STEP 344). The network operator 542 can then consider and compare the results with previous runs.

Note that not all of the input parameters 342 may be necessary for the network operator 542 to input at the Planner UI 540. If some parameters are not provided by the network operator 542, then in some cases the Network planner 530 may use default values. For example, if the coverage dimensions are provided as "length in feet times breadth in feet" at the Planner UI 540, it is an extremely useful form of this parameter. However, if dimensions are not given in this form, or not at all, the Network planner 530 uses the most common dimension that was simulated during Monte Carlo simulation 304. In some embodiments this can be a reasonable method if the prediction database 514 holds slightly conservative estimations.

The Planner UI 540 includes circuitry to abstract the model and provide the network operator 542 with an interactive interface (e.g. a keyboard and monitor) with the Network Planner 530, which assists the network operator 542 to (1) determine the number of BS/APs required responsive to the inputs (STEP 344), (2) vary various parameters in their input set (STEPS 346 and 348) to determine how the output (the number of BS/APs) varies or changes accordingly, and (3) perform a "what if analysis" (STEP 350) to predict how the network performance might be impacted if the spectrum availability changes (reduces or increases) at a later date, post-deployment.

(7) Network Planner "What If" Analysis

In addition to the described estimation process (STEP 344), which is based upon operator input regarding expected deployment at the current moment, a "What if" scenario analysis predicts future changes to one or more input parameters (STEP 350) (including spectrum availability) that may be related to potential future disruptions of service or degradation of network performance. These input parameters might change for example due to future reduction in spectrum availability. For this purpose, spectrum availability predictions may be provided from the Spectrum Availability Repository 558, and input (STEP 351) into the "What if" scenario analysis (STEP 350).

Another aspect of the "what if" scenario analysis is to predict how the network is likely to react if the predicted future problems actually do occur, and anticipate changes that might be needed to the network at the time. (STEP 352) Given this information, suggestions can be made regarding a course of action to minimize adverse future effects. (STEP 354)

The "What if" scenario analysis is performed by a "What if" module 534 in the Network Planner 530, which receives input from the network operator 542 via the Planner UI 540. The "What if" module 534 can also be used by the Network Planner to determine for example how the network scales or otherwise changes if the number of users and/or coverage areas were to change according to the parameter predictions, and provide this to the network operator 542. This is a useful component of the Network Planner 530 since it not only enables a clear idea of what is needed for the current moment but also looks into the future and reduces the risk of abrupt changes to the network that might otherwise be needed.

In summary, the "What if" module 534 allows the network operator 542, at the present time, to become aware of potential problems in the planned enterprise network, and thereby provides an opportunity to minimize the risk of potentially costly reconfigurations and/or upgrades that might otherwise be needed in the future. For example, if the network operator 542 is aware of the effect of potential spectrum availability changes, or the effect of user count changes, the current network plan can be designed with flexibility to adapt to, and possibly avoid, problems that may arise in the future.

Figure 6:
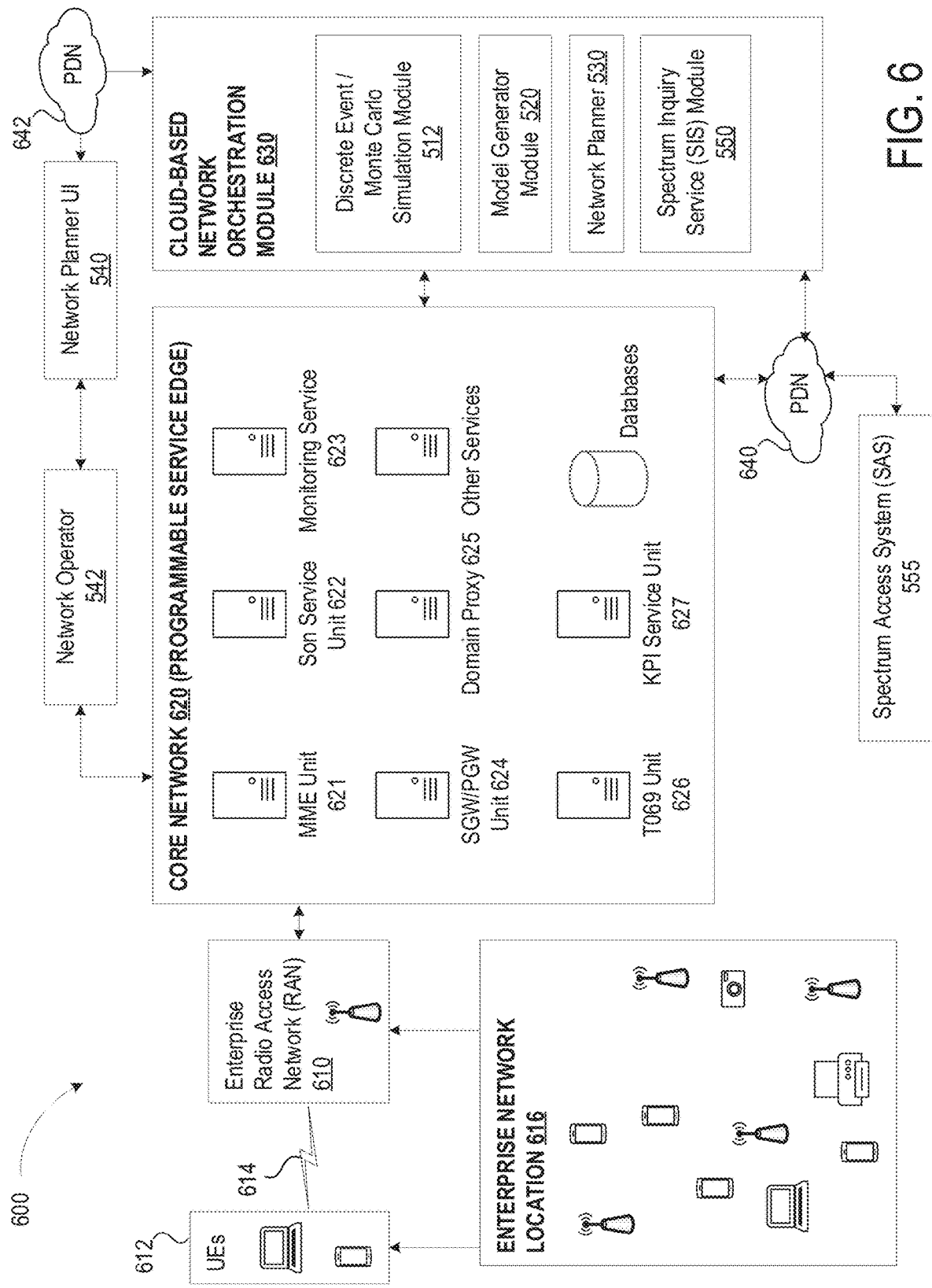
FIG. 6 is a block diagram of an implementation of an enterprise network that can be designed by the Network Planner disclosed herein.

After the Network Planner 530 suggests a plan and a course of action (STEP 354), the Enterprise Network is planned and deployed (STEP 356). An example implementation of a plan and deployment is shown in FIG. 6 and discussed with reference thereto.

(8) Monitoring Service (623) Statistics and Performance Reporting (110), Data Culling/Augmentation (111)

Figure 3D:
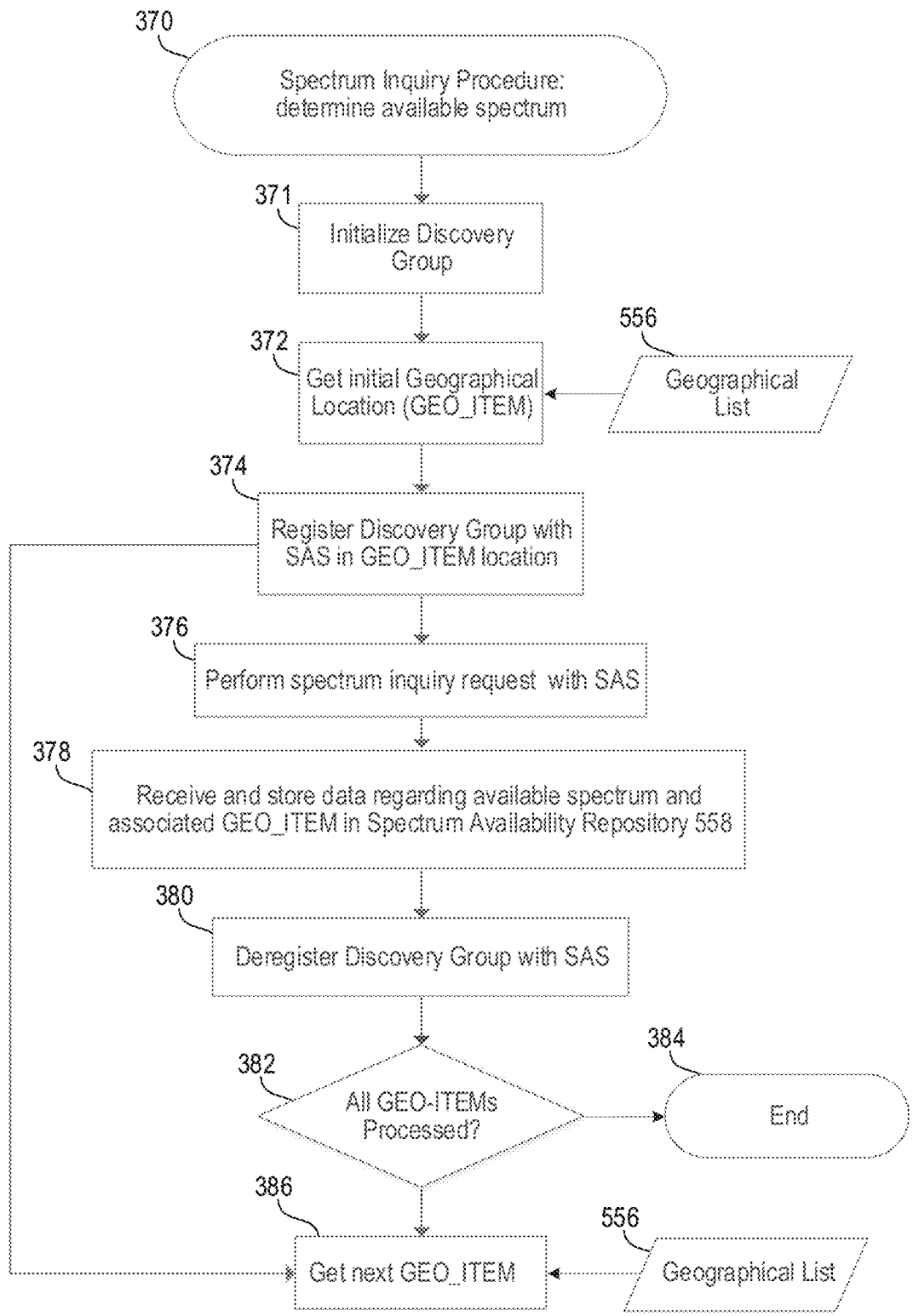
FIG. 3D is a flow chart of operations to perform a Spectrum Inquiry Procedure for use in the Spectrum Availability Procedure shown in the flow chart of FIG. 3C
Figure 3E:
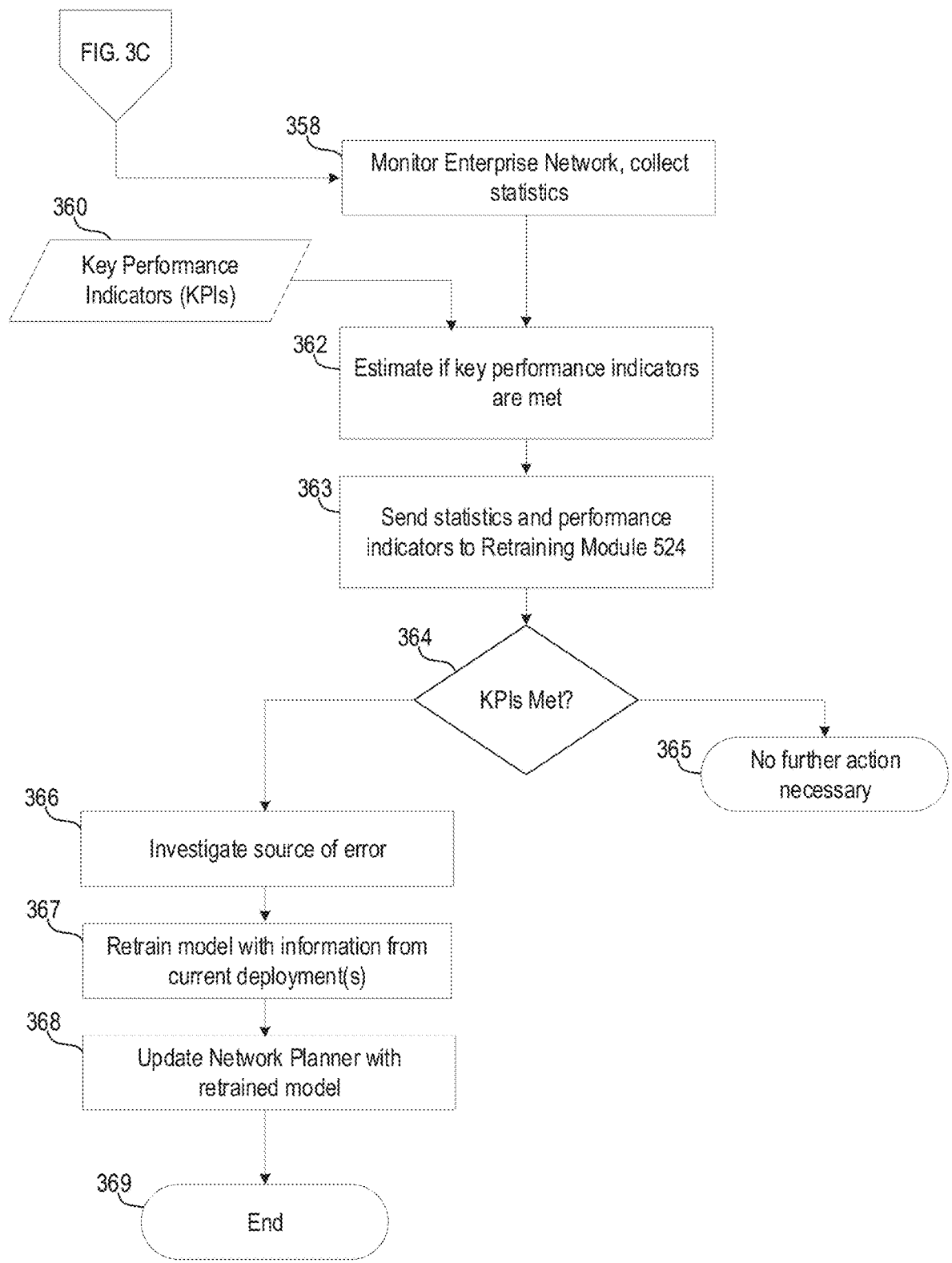
FIG. 3E is a flow chart that combines with FIGS. 3A, 3B, and 3C to show operations to plan, implement, and update a deployment of a CBRS wireless communication network at an enterprise location.

Following a successful deployment (STEP 356), the network operations of the Enterprise Network are monitored to collect statistics (STEP 358, FIG. 3E). Particularly, the network 600 (FIG. 6) collects statistics. Using an input (STEP 360) of key performance indicators (KPIs), the Monitoring service 623 in the core network 620 estimates (STEP 362) if the key performance indicators have been met. For example, KPIs may include the following:

Packet Throughput (IP layer),
Packet latency (IP layer),
Packet loss rate (IP layer), and
Packet jitter rate (IP layer).

Key Performance Indicators (KPIs) may be measured across the network, bearers, or at any suitable network interface. The KPIs can be monitored by the RAN, Core Network and/or devices, in combination or individually.

The Monitoring service 623 periodically (e.g., every 5 minutes) sends (STEP 363) the results and other performance indicator data to the Model training/model retraining module 524 in the Model Generator Module 520 (FIG. 5) to fine tune if necessary. The KPI results are examined (STEP 364) to determine if the KPIs have been met, and if so, then no further action is necessary (STEP 365). For example, if 99.999% of the performance statistics are met, the Model training/retraining module 524 may not need to perform any retraining. However, if they are not met (STEP 364), even if the performance targets are slightly lower, then the source of error can be investigated (STEP 366) and the Model training/model retraining module 524 can be retrained (STEP 367) with data obtained from live deployments. For example, if the performance targets are not met sometimes, it may point to a condition that necessitates a slight increase in the BS/AP count, or a slight modification to the pathloss model. Several key performance counters, such as Block error rates, Handover failure/success rates, peak/mean data rates allow the Monitoring service 623 to estimate the potential MSE in previous model and indicate (STEP 366) the source of error to the Model training/model retraining module 524.

Some of the models 522 are easier to retrain than others. For example, a linear or polynomial regressor model 522 can be retrained quickly and those model updates can be immediately applied to the Network Planner 530. Certain other models, such as clustering models or feedback/feedforward error propagation models, may require a different time span for retraining. These models 522 can be independent of each other and can be updated (STEP 368) in the Network Planner 530 for subsequent use by Planner UI 540. At that point operations end (STEP 369).

(9) Spectrum Availability

As described earlier, spectrum availability is one the important inputs into the Monte Carlo simulator 512. The availability of spectrum immensely sways the simulator output. For example, with 20 MHz of availability, the simulator may determine that seven BS/APs are required for an input combination. However, if the spectrum availability is 80 MHz instead of 20 MHz, the simulator may have estimated five BS/APs to be sufficient. Therefore, for simulation and current planning purposes it is important to have an accurate estimation of the available spectrum, or as accurate an estimation as possible. For longer term planning, it would be useful to provide a good prediction of any changes in the available spectrum (more or less) that have a reasonable likelihood to occur in the future, for any of a number of reasons.

To provide a good estimate of the available spectrum at a number of geographical units, the Network Planner 530 utilizes a Spectrum Inquiry Service (SIS) Module 550 that operates a Spectrum Inquiry Procedure 370. Particularly the Spectrum Inquiry Procedure 370 determines current spectrum availability at each location defined in a geographical list (GEO_ITEMS). The Spectrum Inquiry Procedure 370 can be run periodically (e.g. daily), to generate a time series of data regarding spectrum availability for each location in the GEO_ITEMs list. This information can be used to provide a good estimate of the spectrum availability at a target deployment location of the planned enterprise network; for example an average, an upper bound, and a lower bound of spectrum availability at a nearby location could be used for network planning purposes at the target deployment location. Also, the time series of data can be analyzed by e.g. machine learning and artificial intelligence techniques to learn patterns of spectrum availability, which can be useful to generating a "what if" scenario and predicting future network needs.

(10) Spectrum Inquiry Service Module and Procedure

A Spectrum Inquiry Service (SIS) Module 550 is provided, connected to provide geographical spectrum information to the Network Planner 530. The Spectrum Inquiry Module 530 includes an SIS Control Unit 551, a DISCOVERY_GROUP 552 defined by data for K BS/APs, and an SAS interface 554 that has the appropriate communication capability and credentials to connect with a Spectrum Access Server (SAS) 555. The BS/APs in the DISCOVERY_ GROUP 552 are preregistered with an FCC-approved SAS 555, for example a Google or Federated Wireless SAS. The BS/APs in the DISCOVERY_GROUP 552 need not be actual physical BS/APs, but they have valid serial numbers, valid power classes defined, and can be registered with the SAS 555.

The SIS Module 550 also includes a list of geographies that are defined as measurable: particularly, the SIS Module 550 includes and maintains a geographical list 556 in a database, corresponding to geographical units. For example, a geographical unit can be each "county" in each "state" in the USA. Some "states" are larger and more populous than others and thus a "county" may not directly relate to a size. For example, the states of Colorado and Nevada are approximately equal in area, but Colorado has 64 counties, 330% higher than Nevada. The USA is used here as an example, but the general principle applies to any singular country, or a plurality of countries. In one embodiment, the comprehensive list of counties in the geography database defines a GEO_ITEMs list for which spectrum information is maintained in a Spectrum Availability Repository 558.

(11) Spectrum Inquiry Procedure

FIG. 3D is a flow chart of operations of one embodiment of a Spectrum Inquiry Procedure (STEP 370), in which a series of spectrum inquiries are made, looping through a number of locations specified in a geographical list (the GEO_ITEMs). The Spectrum Inquiry Procedure can then be repeated periodically every N time units (e.g., every 1 day) to provide a time series of data of spectrum availability.

In this embodiment of the Spectrum Inquiry Procedure, after start (STEP 370), the DISCOVEY_GROUP 552 is initialized (STEP 371). As mentioned above, the BS/APs in the DISCOVERY_GROUP are preregistered with an FCC-approved SAS 555, for example a Google or Federated Wireless SAS. The BS/APs in the DISCOVERY_GROUP need not be actual physical BS/APs, but they have valid serial numbers, valid power classes defined, and can be registered with the SAS 555.

Next, the geographical list 556 (the GEO_ITEM list) is provided and the initial geographical location is obtained (STEP 372) to indicate the first GEO_ITEM location. Then the DISCOVERY_GROUP is registered with the SAS at the first GEO_ITEM location; particularly the SIS Control Unit 551 via the SAS Interface Unit 524 registers the DISCOVERY_GROUP with the SAS 555 as being located at the "centroid" of the first item in the GEO_ITEMs list.

A spectrum inquiry request is now made with the SAS 555 (STEP 376), using the SAS interface unit 554, and following standard protocols. In response, the SAS indicates the availability of data, and this information is received and stored, associated with the first GEO_ITEM, in a Spectrum Availability Repository 558. Next, the DISCOVERY_GROUP is deregistered with the SAS (STEP 380).

A decision is made as to whether or not all GEO_ITEMs have been processed, and if so, the process ends (STEP 384). If not (if there are more GEO_ITEMs), then the next GEO_ITEM is obtained from the geographical list, and the process repeats to register the DISCOVERY_GROUP at the current GEO_ITEM iteration (STEP 374) and then continues until all GEO_ITEMs have been processed.

For example, to determine spectrum availability in Douglas County, Nebr., the centroid can be determined to be located approximately at Green Meadows, Nebr. The SIS Control Unit 551 registers the DISCOVERY_GROUP 552 as being present at the "centroid" (the GPS/GNSS coordinates at Green Meadows, Nebr.) and initiates a spectrum inquiry request with the SAS 555. In response, the SAS 555 indicates the availability of spectrum for that indicated geography and the SIS Control Unit 552 stores that information in the Spectrum Availability Repository 558. Further to this, the SIS Control Unit 552 deregisters the DISCOVERY_GROUP at that location, then moves to the next geographical location in the GEO_ITEMs list, and repeats until all items are complete.

Note that an appropriate granularity for spectrum availability in an area can be smaller than or larger than the definition of a county. For example, the granularity at the level of a city or a neighborhood in a city may be necessary for certain places; e.g. for areas at or near San Diego Calif. and Norfolk Va., it may be necessary to track spectrum availability at the more granular level of a suburb. For that reason, the GEO_ITEM list may contain information at broader level (such as county level) and also at a more granular level (such as suburbs of a city) at the same time. Some design tradeoffs here include the volume of data that needs storing, and the mathematical constructs that need to be applied on the voluminous data for inference reasons.

(12) Spectrum Availability Repository

As a result of repeatedly performing the Spectrum Inquiry Procedure 370, the Spectrum Availability Repository 558 now contains a time series of data for each location in the GEO_LIST.

The Spectrum Availability Repository 558 is connected to a machine learning/AI unit 559. Using the time-series data in the Spectrum Availability Repository 558, machine learning principles can be applied to learn any inherent patterns in availability, which helps determine current availability and predict a trend of availability. Thus, for an area referenced by a location closest to the centroid in GEO_ITEM, current spectrum availability is known, as well as a trend of availability at that location. Therefore, when the enterprise operator desires to estimate the number of BS/APs required for their enterprise, the Planner UI 540 can use the actual location (for example the address of the location where the enterprise would be deployed) to enquire regarding spectrum availability and compare that information with historic information contained in the Spectrum Availability Repository 558. This comparison and data manipulation provides a far more accurate input of spectrum availability to the Network Planner 530. As another advantage, in some cases, at the exact time when the network operator 542 decides to plan the network, connectivity issues with SAS 555 may exist and in such cases, the Spectrum Availability Repository 102 provides a useful but sole alternative.

(13) Network Implementation

FIG. 6 is a block diagram of an implementation of an enterprise network 600 that can be designed by the Network Planner disclosed herein. The enterprise network 600 includes a radio access network (RAN) 610 that includes a plurality of BS/APs that wirelessly communicate with a plurality of UEs 612 over a wireless link 614. The BS/APs are installed in an Enterprise Network Location 616, and the UEs are present in or around the Enterprise Location 616 to wirelessly communicate with one or more of the BS/APs. The enterprise network 600 also includes a core network 620 (also called a Programmable service edge or "PSE") that provides a variety of services for the network, and a cloud-based network orchestration module 630 that provides administrative services and other functional units including machine learning and artificial intelligence units. The core network 620, the orchestration module 630 and the SAS 555 may be connected via a Packet Data Network (PDN) 640. Also, the orchestration module 630 and the network planner UI 540 are connected via a Packet Data Network (PDN) 642. In some implementations, the network planner UI 540 may be implemented as part of the orchestration module 630 itself.

The core network 620 includes a plurality of components that provide services for the network, including an MMF (Mobility Management Function) unit 621, a SON (Self Organizing Network) service unit 622, a monitoring service unit 623, an SGW/PGW (Serving Gateway/Packet Data Network Gateway) unit 624, a domain proxy 625, a TR069 unit 626, and a KPI (Key Performance Indicator) service unit 627. The core network 620 may also include units for additional network services as required or useful.

The cloud-based orchestration components 630 include those components shown in the network orchestrator 510 (FIG. 5), including a discrete event/Monte Carlo simulation module 512, a model generator module 520, a network planner 530, a spectrum inquiry service module 550, and other components for remote administration of the enterprise network.

(14) Use Network Planner to Design Network

Suppose the Network Planner 530 estimates K BS/APs are necessary to guarantee success criteria for the set of values input into Planner UI 540. The K BS/APs generate data that need to be serviced by core network components 620 (for example, SGW/PGW unit 624, MME unit 621) on the uplink, and anticipates data on the downlink from these components in 620. The Programmable service edge 620 hosts several network components and they may be hosted on a cloud environment, may be executing on purpose-built hardware or common-off the shelf (COTS) hardware. Depending on the volume of data, number of users, the Programmable service edge 620 needs to scale or be dimensioned correctly.

Compute power (e.g., CPUs), memory and network switching requirements at the interfaces (IP, Ethernet interface) between components and modules are dimensioned appropriately to support the K BS/APs supporting U users at demand D. The Network Planner 530 recommends the resources required for the Programmable service edge 620 to maintain the success criteria. In some cases, it may be appropriate to deploy the Programmable service edge 620 on the cloud, in other cases depending on the application types and deployment modes, it would not be appropriate to deploy the Programmable service edge 620 on the cloud. For example, if certain low latency applications require applications to be hosted closer to the radio access network 610, then the Programmable service edge 620 may have to be deployed on specific hardware on-premises with the rest of the equipment. The network planner 530 considers the application types and the use cases to recommend the Programmable service edge 620 needs.

Although the disclosed method and apparatus is described above in terms of various examples of embodiments and implementations, it should be understood that the particular features, aspects and functionality described in one or more of the individual embodiments are not limited in their applicability to the particular embodiment with which they are described. Thus, the breadth and scope of the claimed invention should not be limited by any of the examples provided in describing the above disclosed embodiments.

Terms and phrases used in this document, and variations thereof, unless otherwise expressly stated, should be construed as open-ended as opposed to limiting. As examples of the foregoing: the term "including" should be read as meaning "including, without limitation" or the like; the term "example" is used to provide examples of instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described with the aid of block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method of planning, deploying, and operating a spectrum-controlled, wireless communication network that includes a plurality of Base Stations/Access Points (BS/APs) located within an enterprise location, the BS/APs communicating wirelessly with a plurality of User Equipment devices (UEs), comprising the steps of:

generating a plurality of network models using machine learning techniques responsive to a predictor space that includes at least one of spectrum availability, topology definitions, Node/Link configurations, pathloss models, and line-of-sight probabilities;

storing said network models in a models database;

providing said network models to a network planner;

receiving input into said network planner regarding intended deployment, including location and at least one of building type, network requirements, and number of devices;

responsive to said location input, determining spectrum availability at said location; and responsive to said input and spectrum availability, estimating and deploying a number of BS/APs needed to cover the intended deployment.

2. The method of claim 1 wherein the method further comprises the steps of:
- providing a predictor space that includes at least one of spectrum availability, topology definitions, Node/Link configurations, pathloss models, and line-of-sight probabilities;
- performing a Discrete Event/Monte Carlo simulation responsive to said predictor space;
- storing successful iterations of said simulation in a Predictor Database; and
- generating said network models responsive to said successful iterations.

3. The method of claim 1 further comprising the steps of:
- planning a network responsive to said estimate, and deploying the plan for an enterprise network;
- monitoring operation of said enterprise network, including collecting statistics regarding network operation; and
- determining whether or not said operation is meeting key performance indicators (KPIs);
  - if it is meeting the KPIs then continuing network operation without change,
  - if it is not meeting the KPIs then retraining said model and updating the network planner with the retrained model.

4. The method of claim 1 wherein the method further comprises the steps of:
- predicting spectrum availability at a plurality of locations; and
- selecting one of said locations responsive to said location input, and providing the associated predicted spectrum availability to the network planner.

5. The method of claim 4 wherein the spectrum is controlled by a Spectrum Access System (SAS), and said step of predicting spectrum availability includes the steps of inquiring regarding spectrum availability with said SAS at each of said plurality of locations, and storing said spectrum availability for each of said plurality of locations.

6. The method of claim 4 further comprising the steps of:
- modifying said network plan responsive to said predicted spectrum availability; and
- deploying said wireless network responsive to said modified network plan.

7. A network orchestration module for planning and administering a plurality of spectrum-controlled, wireless communication networks, each network including a plurality of Base Stations/Access Points (BS/APs) located at an enterprise location, the BS/APs communicating wirelessly with a plurality of User Equipment devices (UEs), the network orchestration module comprising:
- a model generator module including a network training module that includes machine learning and artificial intelligence for generating a plurality of network models responsive to a predictor database;
- a models database for storing the network models;
- a Spectrum Availability Repository that stores spectrum availability at a plurality of locations;
- a network planner connected to the models database for storing and implementing at least one of said network models, said network planner also connected to the Spectrum Availability Repository;
- means for receiving input into said network planner regarding intended deployment of an enterprise network, said input including enterprise network location; and
- wherein the network planner further is connected to the Spectrum Availability Repository for determining spectrum availability responsive to the enterprise network location.

8. The network orchestration module of claim 7 further comprising:
- a Spectrum Inquiry Service Module for predicting spectrum availability at each of a plurality of locations and storing said predicted spectrum availability in the Spectrum Availability Repository.

9. The network orchestration module of claim 8 wherein said Spectrum Inquiry Service Module is connected to a remote Spectrum Access Service (SAS), and includes means for inquiring with the SAS regarding spectrum availability at a plurality of locations.

10. The network orchestration module of claim 9 further comprising means for periodically repeating said inquiry with the SAS to provide a time series of spectrum availability data for each of the plurality of locations.

11. The network orchestration module of claim 7 wherein:
- said input to the network planner further includes at least one of building type, network requirements, and number of devices; and
- further comprising an estimation module, responsive to said input and spectrum availability, for estimating a number of BS/APs needed to cover the enterprise deployment, and means for planning a network responsive to said inputs and said estimate of number of BS/APs.

12. The network orchestration module of claim 11 further comprising means for planning a network responsive to said inputs and said estimate of number of BS/APs.

13. The network orchestration module of claim 7 wherein the plurality of spectrum-controlled networks, include Citizen's Broadband Radio Service (CBRS) networks, and the BS/APs comprise CBRS devices (CBSDs).

14. The network orchestration module of claim 7 further comprising:
- a Discrete Event/Monte Carlo Simulation Module including
  - a predictor space input that includes at least one of spectrum availability, topology definitions, Node/Link configurations, pathloss models, and line-of-sight probabilities;
  - means for performing a Discrete Event/Monte Carlo simulation responsive to said predictor space; and
  - a Predictor Database for storing successful iterations of said simulation;
- wherein the Predictor Database is connected to the Model Generator Module, which generates at least one network model responsive to said successful iterations.

15. The network orchestration module of claim 7, wherein the network training module further includes a retraining unit that includes machine learning and artificial intelligence for retraining the plurality of network models, and further comprising:
- means for receiving data regarding network operation; and
- means responsive to said data for determining whether or not said network operation is meeting key performance indicators (KPIs), if it is meeting KPIs then continuing network operation without change, if it is not meeting KPIs then retraining said model and updating the network planner with the retrained model.

16. The network orchestration module of claim 7 wherein said means for receiving input into said network planner includes a network planner UI.

* * * * *